United States Patent [19]
Crowell

[11] 4,037,899
[45] July 26, 1977

[54] MINIATURE SOCKET ASSEMBLY
[75] Inventor: Kenneth E. Crowell, Fort Lauderdale, Fla.
[73] Assignee: Motorola, Inc., Schaumburg, Ill.
[21] Appl. No.: 644,666
[22] Filed: Dec. 29, 1975

Related U.S. Application Data
[63] Continuation of Ser. No. 563,746, March 31, 1975, abandoned.

[51] Int. Cl.² .................................. H05K 1/10
[52] U.S. Cl. ........................ 339/17 C; 339/275 B
[58] Field of Search .............. 339/17 R, 17 C, 256 R, 339/258 R, 275 B; 29/626; 427/58, 96, 123, 259, 264, 270, 272, 282; 228/260

[56] References Cited
U.S. PATENT DOCUMENTS

| 3,222,632 | 12/1965 | Fuller | 339/17 R X |
| 3,268,851 | 8/1966 | Mancini | 339/275 B X |
| 3,292,138 | 12/1966 | Jones et al. | 339/220 R |
| 3,601,662 | 8/1971 | De Barros | 29/626 X |
| 3,681,744 | 8/1972 | Olsson | 339/17 C |
| 3,850,491 | 11/1974 | Mouissie | 339/17 C |
| 3,865,455 | 2/1975 | Berg et al. | 339/17 C |
| 3,899,232 | 8/1975 | Berg et al. | 339/17 C |

OTHER PUBLICATIONS
Byrnes et al.; "Printed Circuit Board Hole Addition"; IBM Tech Disclosure Bulletin, vol. 7, No. 6, Nov. 1964, p. 514.

Primary Examiner—Roy Lake
Assistant Examiner—Mark S. Bicks
Attorney, Agent, or Firm—Margaret Marsh Parker; James W. Gillman

[57] ABSTRACT

An improved socket assembly is disclosed which is especially suited for use with printed circuitry. The socket is mounted on an associated printed circuit board and is adapted to receive and retain guide pins of electronic circuit modules or the like. The socket assembly further includes a non-metallic insert, such as Teflon or equivalent material, which is introduced into the socket before soldering. The insert is unaffected by the molten solder or flux and prevents entry of contaminating material into the interior of the socket during the soldering process. The insert is removable by the insertion of a module guide pin during assembly of the component mounting board.

5 Claims, 4 Drawing Figures

MINIATURE SOCKET ASSEMBLY

This is a continuation of application Ser. No. 563,746, filed Mar. 31, 1975, now abandoned.

BACKGROUND OF THE INVENTION

1. Field of the Invention

This invention relates to the field of miniature socket assemblies and, more specifically, to such socket arrangements of the type mounted on an insulating base and which are required to have an aperture at both ends of the socket body allowing the inserted pin of a component to extend through and beyond the socket but without allowing the entrance of solder or flux when the base is exposed to molten solder.

2. Prior Art

Miniature socket arrangements of the type used on printed circuit boards along with other circuit connections and components have in the past been soldered by dipping the board below the surface of molten solder such as in a conventional flow solder process. Since the sockets were conventionally closed at the bottom end, the solder as well as flux could be prevented from contaminating the interior of the socket by filling the socket with a suitable liquid material. While this procedure did prevent contamination, after soldering was complete, an extra production step was necessary to remove the liquid material. Two changes in the art brought about a need for a different solution. One was the use of open bottom sockets which allow the guide pins of a module to project through and beyond the socket so that pressure on the bottom of the pins could be used to help unseat the module. However, these open bottom sockets would not retain the fluid material which had previously prevented solder and flux contamination. The second change was the development of "wave" soldering which provides a fresh molten solder surface to the board for effective soldering without submerging the board. This meant that only the bottom opening of the socket needed to be protected from the solder-flux invasion and resultant contamination.

SUMMARY OF THE INVENTION

It is therefore a general object of this invention to provide an improved small socket to be used on an insulating base which is to be wave soldered.

It is a specific object of the invention to provide pass-through capability for module pins which are to be inserted in the socket, allowing case of module removal, without allowing solder or flux to enter the interior of the socket during the soldering process.

It is a more specific object of the invention to prevent socket contamination by means which can be applied as the socket is formed and which can be removed by the insertion of a pin of a module into the socket.

It is another specific object of the invention to provide these capabilities in a manner which is simple, inexpensive and effective.

To achieve the above objectives the socket according to the invention is designed to be of a shorter length than the pins which are to be inserted in them so that when a module is inserted the pins protrude from the bottom of the socket. Thus, when it is required to release the module, pressure can be applied to the protruding ends of its pins to assist in module release. Since such sockets are generally exposed to a wave of molten solder and flux during assembly of a component mounting base such as a printed circuit board, an insert of a non-metallic, low friction material, such as Teflon, for example, is inserted into the socket at the time the socket is formed or assembled. The insert material is chosen for its ability to be easily inserted; to withstand any effects of the molten solder, flux or solvents; to repel the molten solder, preventing its entry into the socket interior; and to be easily removed after the soldering and associated processes are complete, leaving the inside of the socket uncontaminated. In actual practice the insert is removed merely by inserting the pins of the component with which the socket is to be used.

DETAILED DESCRIPTION OF THE INVENTION

Figure 1:
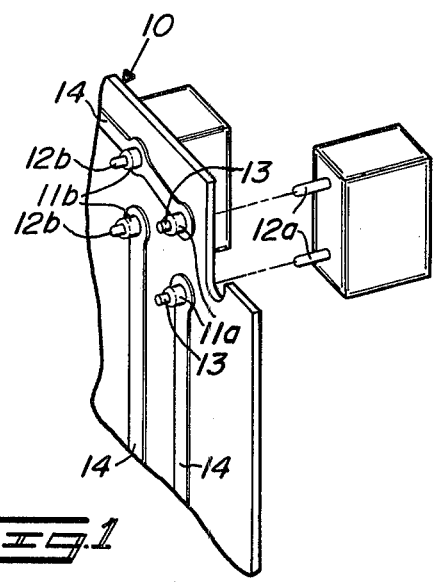
FIG. 1 is a perspective view of a portion of a component board with attached sockets according to a preferred embodiment of the invention.

Referring now more particularly to the drawing wherein like numbers are used throughout to designate like parts, FIG. 1 shows a perspective view of a circuit board 10 and associated circuit components which utilize a preferred embodiment of the present invention. A printed circuit board 10 has mounted on it a multiplicity of sockets 11 (four of which are shown). Sockets 11a have never had module pins 12a inserted in them, therefore, each of the sockets 11a retains a plastic tubing insert 13 (synthetic resin polymer such as Teflon is the preferred material). Sockets 11b have module pins 12b inserted in them and the plastic inserts have already been ejected. Electrical connections to the sockets are shown as typical bands of copper plating, but the means or method of making such connection is not relevant to the invention beyond the fact that it require solder on the side of the base opposite to the side of module insertion.

Figure 2:
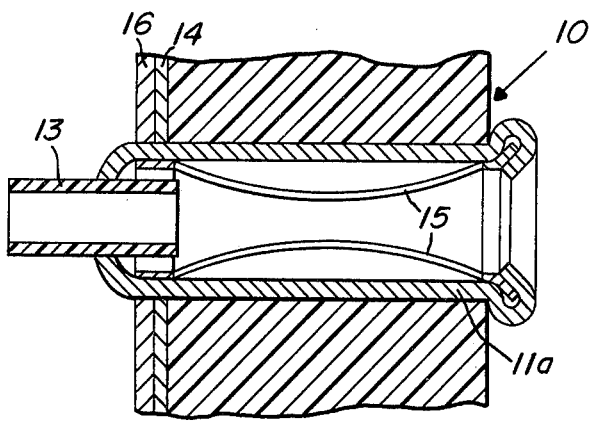
FIG. 2 is a greatly enlarged partial sectional view through a first portion of FIG. 1 showing a mounted socket assembly before insertion of a component.
Figure 4:
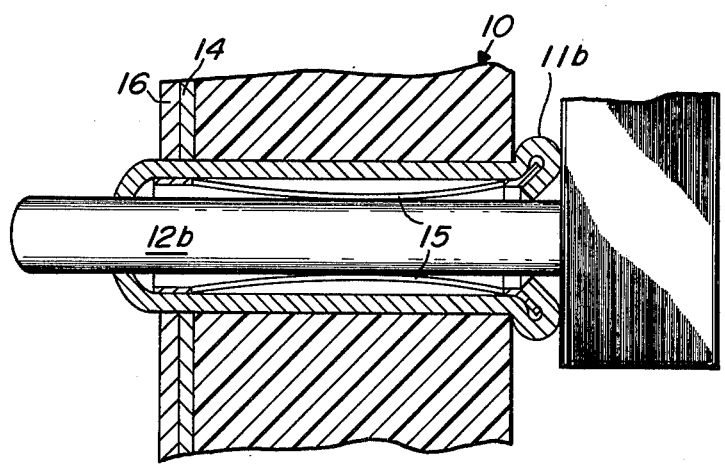
FIG. 4 is a greatly enlarged partial sectional view through a second portion of FIG. 1 showing a mounted socket with a module pin inserted.
Figure 3:
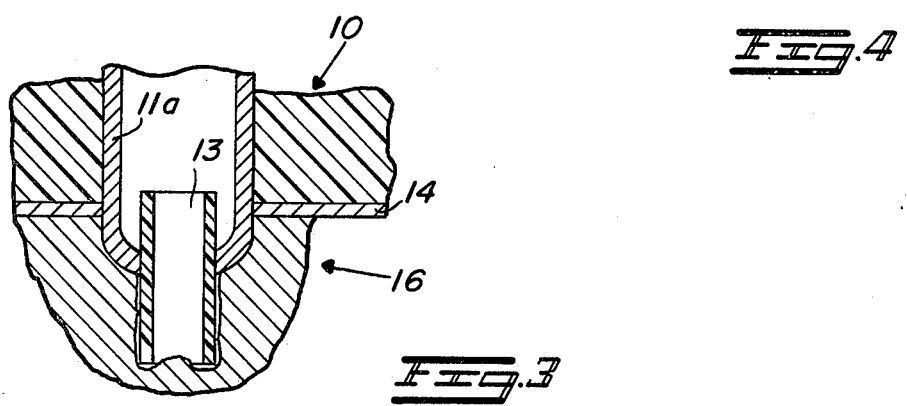
FIG. 3 is similar to a portion of FIG. 2 which shows the socket during the actual wave soldering operation.

FIG. 2 shows more clearly the placement of the insert 13 in the socket. A spring 15 of a material such as beryllium copper is positioned on the inside of the socket. This spring provides an extra measure of retention of the pin in the socket and more dependable electrical contact between the pin and the socket. In FIG. 3, the resilient plastic insert 13 is shown in place in the socket 11a, repelling a wave of solder 16 and preventing any contamination of the interior of the socket. FIG. 4 is similar to FIG. 2 but shows the socket 11b after the insertion of a module pin 12b.

The invention described above comprises a means of successfully soldering small open bottomed sockets on bases such as printed circuit boards in a production type setup without contaminating the interior of the socket. The socket itself is of generally tubular shape, i.e., having a throughbore as indicated in the drawing. It extends slightly above and below the printed circuit board and is formed of a metal receptive to solder. The dimensions of the socket and the beryllium spring which is inserted into the socket are such as to receive and releasably retain the module guide pins, and to allow the guide pins to project through the bottom opening of the socket. As the invention is practiced in the preferred embodiment, short precut lengths of the plastic tubing are supplied to the machine which forms the socket and inserts the metal spring in the socket. Substantially one-half of a section of tubing is inserted through the opening in the bottom end of each socket. It should be noted here that the use of a solid plastic plug falls within the scope of this invention although tubing is preferred. The insert is of such a diameter as to be easily inserted and easily ejected when desired, yet large enough to deform slightly on insertion to provide retention of the insert while needed. On the production line, the sockets are inserted into appropriately sized holes in an insulating base, such as a printed circuit board, along with other components to be soldered. During the soldering process, the bottom side of the board is subjected to flux, a wave or fountain of solder and possibly other liquids such as solvents. These are not allowed to wash over the upper surface of the board. The material of the tubing repels these fluid materials and the repulsion, combined with their surface tension, prevents them from passing through into the interior of the socket. The plastic insert is left in place until the plug-in modules are to be inserted. Essentially no extra force is required to eject the plastic insert as the module pins are inserted, and no extra production step is required to remove them.

What is claimed is:

1. An improved socket assembly for receiving component guide pins, including in combination:
    a base formed of insulating material and having plated conductor means on at least one side thereof;
    a socket means mounted on said base and extending therethrough a predetermined distance, said socket means including a throughbore along the longitudinal axis with openings at respective ends thereof,
    said base and socket means mounted thereon being adapted for flow wave soldering treatment to permanently interconnect said socket means to said plated conductor means;
    resilient conductive means positioned in the socket means for applying additional pressure on an inserted guide pin, and
    a resilient plastic tubing insert extending through the opening of said socket means from the side of said base having said plated conductor means thereon and into a portion of the interior of the resilient conductive means, said insert being positioned in the socket means during the manufacture of said socket means, maintained therein during the soldering operation and removable by the insertion of said guide pins.

2. A socket assembly according to claim 1 wherein the insulating base is a printed circuit board.

3. A socket assembly according to claim 1 wherein the resilient conductive means is a beryllium copper spring.

4. A socket assembly according to claim 1 wherein the resilient plastic insert means is formed of a material with a low coefficient of friction and dimensioned to make a friction fit within said socket means for retention during the soldering operation while being easily removable therefrom upon the insertion of a component guide pin.

5. A socket assembly according to claim 4 wherein the plastic insert is of a synthetic resin polymer.

* * * * *